US008629364B2

(12) United States Patent
Krier et al.

(10) Patent No.: US 8,629,364 B2
(45) Date of Patent: Jan. 14, 2014

(54) METHOD FOR IMPLEMENTING CAPACITIVE SENSING IN THE PRESENCE OF CONDUCTIVE DECORATIVE MATERIALS

(75) Inventors: James Frederick Krier, Grosse Pointe Woods, MI (US); David Michael Whitton, Saline, MI (US)

(73) Assignee: Visteon Global Technologies, Inc., Van Buren Township, MI (US)

( * ) Notice: Subject to any disclaimer, the term of this patent is extended or adjusted under 35 U.S.C. 154(b) by 651 days.

(21) Appl. No.: 12/714,681

(22) Filed: Mar. 1, 2010

(65) Prior Publication Data

US 2011/0209976 A1 Sep. 1, 2011

(51) Int. Cl.
*H03K 17/975* (2006.01)

(52) U.S. Cl.
USPC .......................................................... 200/600

(58) Field of Classification Search
USPC .................................. 200/600, 512, 310–317
See application file for complete search history.

(56) References Cited

U.S. PATENT DOCUMENTS

| 4,017,848 | A | * | 4/1977 | Tannas, Jr. ..................... 345/173 |
| 4,878,107 | A | | 10/1989 | Hopper |
| 4,901,074 | A | * | 2/1990 | Sinn et al. ..................... 200/512 |
| 4,975,676 | A | * | 12/1990 | Greenhalgh ................... 200/5 A |
| 6,057,520 | A | * | 5/2000 | Goodwin-Johansson .... 200/181 |
| 6,088,471 | A | * | 7/2000 | Setlak et al. ................... 382/124 |
| 6,960,841 | B2 | | 11/2005 | Saitou et al. |
| 7,395,717 | B2 | * | 7/2008 | DeAngelis et al. ............. 73/728 |
| 7,436,315 | B2 | | 10/2008 | Kamizono et al. |
| 7,671,289 | B2 | * | 3/2010 | Matsukawa et al. .......... 200/313 |
| 7,782,230 | B2 | * | 8/2010 | Olodort et al. ..................... 341/22 |
| 8,017,884 | B2 | * | 9/2011 | Huang et al. ................... 200/600 |
| 8,110,765 | B2 | * | 2/2012 | Marcus et al. ................. 200/512 |
| 2006/0278508 | A1 | * | 12/2006 | Marcus et al. ................. 200/310 |
| 2008/0142352 | A1 | * | 6/2008 | Wright .......................... 200/600 |
| 2009/0091906 | A1 | * | 4/2009 | Arione et al. .................. 361/781 |
| 2009/0108985 | A1 | | 4/2009 | Haag et al. |
| 2010/0061143 | A1 | * | 3/2010 | Carley .......................... 365/154 |
| 2010/0179725 | A1 | * | 7/2010 | Boote et al. ..................... 701/36 |
| 2011/0057899 | A1 | * | 3/2011 | Sleeman et al. .............. 345/174 |

* cited by examiner

*Primary Examiner* — Briggitte R Hammond
(74) *Attorney, Agent, or Firm* — Fraser Clemens Martin & Miller LLC; J. Douglas Miller

(57) ABSTRACT

A control panel is disclosed. The control panel includes an electrically conductive substrate having a front surface. A first dielectric layer is disposed on the front surface of the substrate. A first electrode layer is disposed on a front surface of the first dielectric layer, wherein the first dielectric layer electrically isolates the first electrode layer from the substrate. The first electrode layer is in electrical communication with a switch circuit adapted to detect a change in a capacitance of the first electrode layer. A substantially transparent film can be provided to cover the electrode. The front surface of the substrate is a decorative surface substantially visible through the first dielectric layer, the first electrode layer, and the film.

16 Claims, 2 Drawing Sheets

METHOD FOR IMPLEMENTING CAPACITIVE SENSING IN THE PRESENCE OF CONDUCTIVE DECORATIVE MATERIALS

FIELD OF THE INVENTION

The invention relates to a capacitive sensing switch. More particularly, the invention is directed to a capacitive sensing switch for a control panel including an electrically conductive decorative material.

BACKGROUND OF THE INVENTION

Automotive display control panel technology is moving from traditional non-interactive displays and mechanical switches to touch-sensitive screens and electronic sensing switches. One type of sensing switch is commonly referred to as a capacitive sensing switch. The capacitive sensing switch typically includes an electrode adapted to create an electric field adjacent thereto which generally defines a sensing zone. The electrode is coupled to a rear surface of a non-electrically conductive or a low-electrically conductivity panel, wherein the electrode is in electrical communication with sensing circuitry. When a conductive or a charged object such as a finger of a person, for example, is placed within the sensing zone on a front surface of the panel, the finger interacts with the electrical field and changes the capacitance of the electrode. The changed capacitance is detected by the sensing circuitry, indicating the occurrence of a switching event.

Electrically conductive panels are known to spread the electrical field from the electrode which reduces the sensitivity of the capacitive sensing switch within the desired sensing zone. Further, spreading the electric field extends the overall area of the sensing zone of the capacitive sensing switch which can result in undesirable switching performance. This is also present with the use of electrically conductive decorative finishes disposed on a surface of a control panel.

It is often desired to use the capacitive sensing switch with electrically conductive panels or panels having electrically conductive decorative finishes thereon. For example, electrically conductive decorative finishes are often employed with control panels to provide a desired aesthetic appearance to a passenger compartment for an automobile. When such electrically conductive decorative finishes have been used, the spreading of the electrical field of the electrode has been reduced by electrically isolating the portion of the panel within the sensing zone from the remainder of the panel and grounding the remainder of the panel. However, electrically isolating the portion of the panel within the sensing zone can cause unwanted performance characteristics in the capacitive sensing switch and produce an unwanted aesthetic appearance on the front surface of, the panel.

It would be desirable to produce a capacitive sensing switch for a control panel having a decorative surface formed from an electrically conductive material, wherein the electrically conductive material adjacent a sensing zone of the capacitive sensing switch is not electrically isolated from the remaining portions of the electrically conductive material and the electrically conductive material does not substantially spread an electrical field of the capacitive sensing switch to a point that a performance of the capacitive sensing switch is functionally compromised.

SUMMARY OF THE INVENTION

Compatible and attuned with the present invention, a capacitive sensing switch for a control panel, the control panel having a decorative surface formed from an electrically conductive material, wherein the electrically conductive material adjacent a sensing zone of the capacitive sensing switch is not electrically isolated from the remaining portions of the electrically conductive material and the electrically conductive material does not substantially spread an electrical field of the capacitive sensing switch to a point that a performance of the capacitive sensing switch is functionally compromised, has surprisingly been discovered.

In one embodiment, a control panel comprises an electrically conductive substrate having a front surface, wherein the substrate is electrically grounded; a first dielectric layer disposed on the front surface of the substrate; and a first electrode layer disposed on a front surface of the first dielectric layer and electrically isolated from the substrate, wherein the first electrode layer is in electrical communication with a switch circuit adapted to detect a change in a capacitance of the first electrode layer.

In another embodiment, a control panel comprises an electrically conductive substrate having a front surface, wherein the substrate is electrically grounded; a substantially transparent first dielectric layer disposed on the front surface of the substrate; a substantially transparent first electrode layer disposed on a front surface of the first dielectric layer and electrically isolated from the substrate, the first electrode layer in electrical communication with a switch circuit adapted to detect a change in a capacitance of the first electrode layer; and a substantially transparent film covering the first electrode layer.

The invention also provides methods for forming a control panel. One method comprises the steps of providing an electrically conductive substrate having a front surface, wherein the substrate is electrically grounded; disposing a substantially transparent first dielectric layer on the front surface of the substrate; disposing a substantially transparent electrode layer on a front surface of the first dielectric layer, the first electrode layer electrically isolated from the substrate and in electrical communication with a switch circuit adapted to detect a change in a capacitance of the first electrode layer; and covering the first electrode layer with a substantially transparent film.

BRIEF DESCRIPTION OF THE DRAWINGS

The above, as well as other advantages of the present invention, will become readily apparent to those skilled in the art from the following detailed description of the preferred embodiment when considered in the light of the accompanying drawings in which.

DETAILED DESCRIPTION OF EXEMPLARY EMBODIMENTS OF THE INVENTION

The following detailed description and appended drawings describe and illustrate various embodiments of the invention. The description and drawings serve to enable one skilled in the art to make and use the invention, and are not intended to limit the scope of the invention in any manner. In respect of the methods disclosed, the steps presented are exemplary in nature, and thus, the order of the steps is not necessary or critical.

Figure 1:
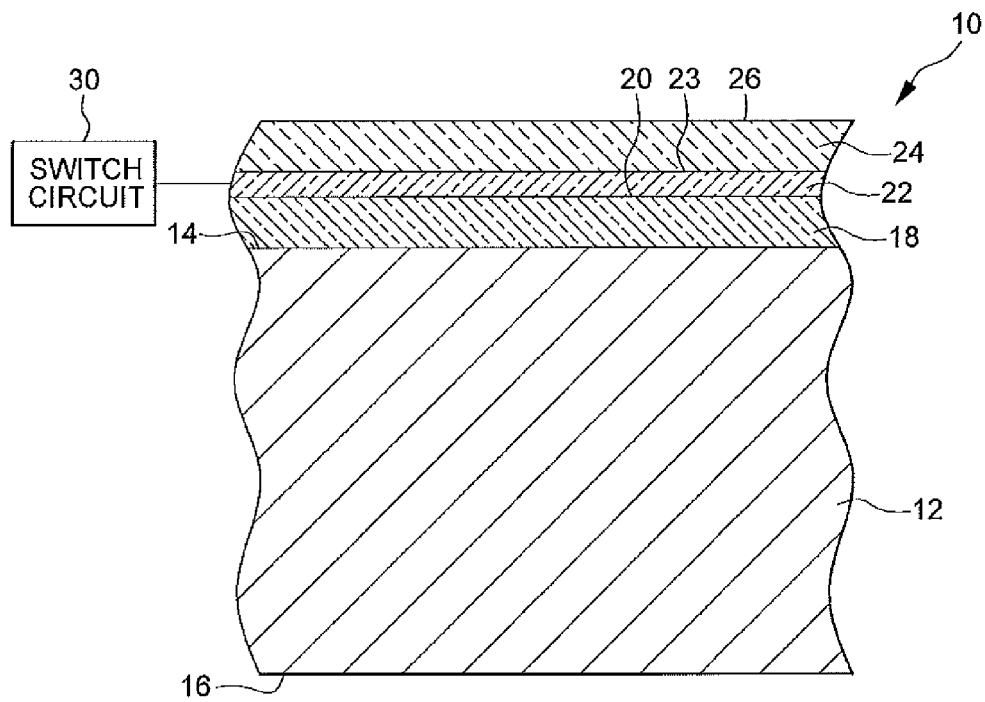
FIG. 1 is a schematic fragmentary cross sectional elevational view of a control panel according to an embodiment of the present invention.

FIG. 1 illustrates a control panel 10 including an electrically conductive substrate 12, a dielectric layer 18, an electrode layer 22, and a protective film 24. It should be understood that the control panel 10 can be adapted for use within a vehicle such as an automobile, for example, wherein the control panel 10 is disposed within or integral with a console, a dash board, a trim panel, and other surfaces in an interior of the vehicle in a plurality of configurations.

The conductive substrate 12 includes a front surface 14 and a back surface 16. The conductive substrate 12 can be produced from a metallic sheet, an electrically conductive composite material having a desired electrical conductivity, or any other material having suitable electrical conductivity. The conductive substrate 12 is electrically grounded. It should be understood that rather than electrically grounding the conductive substrate 12, a reference signal can be provided to the conductive substrate 12. It should be further understood that the front surface 14 of the conductive substrate 12 is visible to a user and provides a desired aesthetic appearance to the control panel 10. Additionally, the front surface 14 of the conductive substrate 12 can include decorative designs and indicia such as letters, words, and numbers formed thereon, for example, wherein the decorative designs and indicia are visible to the user. The back surface 16 of the conductive substrate 12 can be provided with one or more attachment members (not show) such as bosses, tabs, clips, and the like, for example, to facilitate mounting the conductive substrate 12 to a support. Further, the back surface 16 of the conductive substrate 12 can be provided with one or more structural members (not shown) such as reinforcing ribs and the like, for example, to provide a desired rigidity or other physical property to the conductive panel 12.

The electrode layer 22 is in electrical communication with a switch circuit 30 as is known in the art to form a capacitive sensing switch. The switch circuit 30 provides electrical energy to the electrode 22 to create an electric field adjacent thereto. Further, the switch circuit 30 is adapted to detect changes in a capacitance of the electrode layer 22, wherein the changed capacitance indicates the occurrence of a switching event. It should be understood that the electrode layer 22 and the switch circuit 30 can be adapted to provide a plurality of capacitive sensing switches providing switching for selected devices such as HVAC systems, sound systems, and other accessories typically provided in vehicles, for example.

The dielectric layer 18 is interposed between the conductive substrate 12 and the electrode layer 22, wherein the dielectric layer 18 is disposed on the front surface 14 of the conductive substrate 12 and the electrode layer 22 is disposed on a front surface 20 of the dielectric layer 18. The dielectric layer 18 electrically isolates the electrode layer 22 from the conductive substrate 12. The protective film 24 may be disposed on a front surface 23 the electrode layer 22 to provide protection from the surrounding environment, militate against physical wear of the electrode layer 22, and provide desired tactile and visual attributes to a front surface 26 of the control panel 10, for example.

The dielectric layer 18, the electrode layer 22, and the protective film 24 are substantially visually imperceptible to the user to maintain the visibility of the front surface 14 of the conductive substrate 12. The dielectric layer 18 can be produced from a single layer and a multi-layer polymer film, for example. It should be understood that the dielectric layer 18 can be formed from any substantially transparent or translucent material now known or later developed providing effective electrical isolation of the electrode layer 22 from the conductive substrate 12. The electrode layer 22 can be produced from a substantially transparent or translucent material such as indium tin oxide, for example, or from electrical traces small in size to be substantially imperceptible to the user. The protective film 24 can be produced from a substantially transparent material such as PET (polyester), PC (polycarbonate), PEN (Polyethylene), PES (Polyethersulfone), an acrylic, a plastic resin, and any other material now know or later developed having suitable physical, electrical, and chemical properties.

The electrode layer 22 includes electrical traces (not shown) to provide electrical communication between the electrode layer 22 and the switch circuit 30. Interconnections between the electrical traces and the switch circuit 30 are also provided. The electrical traces and the interconnections are substantially imperceptible to the user by employing substantially transparent or translucent materials, by producing electrical traces and interconnections that are small in size, or by concealing the electrical traces and the interconnections behind panel trim pieces and the like, for example. It should be understood that the electrical traces and the interconnections are also electrically isolated from the conductive substrate 12.

In use, the control panel 10 is formed by disposing the dielectric layer 18 on the front surface 14 of the conductive substrate 12. The electrode layer 22 is disposed on the front surface 20 of the dielectric layer 18. The protective film 24 may be disposed on the front surface 23 of the electrode layer 22 to provide a protective covering thereto. It should be understood that the control panel 10 can be formed in a variety of shapes such as a substantially flat panel and a curvilinear panel, for example. The switch circuit 30 is typically located remotely from the electrode layer 22, wherein additional electrical traces, electrical conductors, and interconnections provide electrical communication between the electrode layer 22 and the switch circuit 30.

The control panel 10 is typically mounted to a support structure. The front surface 14 of the conductive substrate 12 is positioned to be visible to and readily accessible by the user. For example, when the control panel 10 is a part of a dash board of an automobile, the dash board is mounted to appropriate support members in the interior of the automobile employing the attachment members formed in the back surface 16 of the conductive substrate 12 and/or other attachment members such as threaded fasteners, for example. The conductive substrate 12 is electrically grounded and the electrode layer 22 is placed in electrical communication with the switch circuit 30. Once installed, the control panel 10 provides a capacitive sensing function to the user. Specifically, the switch circuit 30 provides electrical energy to the electrode layer 22 causing the electrical field to be created adjacent thereto and forming the sensing zone adjacent the front surface 26 of the control panel 10. A finger positioned in proximity to the sensing zone interacts with the electrical field of the electrode layer 22 and changes the capacitance value of the electrical field of the electrode layer 22, wherein the changed capacitance is detected by the switch circuit 30 as a switching event. It should be understood that the electrode layer 22 can be adapted to provide a plurality of sensing zones adjacent the front surface 26 of the control panel 10. Since the electrode layer 22 is electrically isolated from the conductive substrate 12 and the electric field does not extend through the conductive substrate 12 to form the sensing zone, the electrical field is not spread out by the conductive substrate 12. Accordingly, the sensing zone is maintained in a desired location and a performance of the capacitive sensing switch is maximized. Further, since the dielectric layer 18, the electrode layer 22, and the protective film 24 are substantially imperceptible to the user, the front side 14 of the conductive substrate 12, together with any decorative designs and indicia formed thereon, remains visible to the user. The control panel 10 provides for the use of a decorative electrically conductive material as a decorative visible surface, wherein the performance of the capacitive sensing switch is maximized and options for producing a desired aesthetic appearance are maximized.

Figure 2:
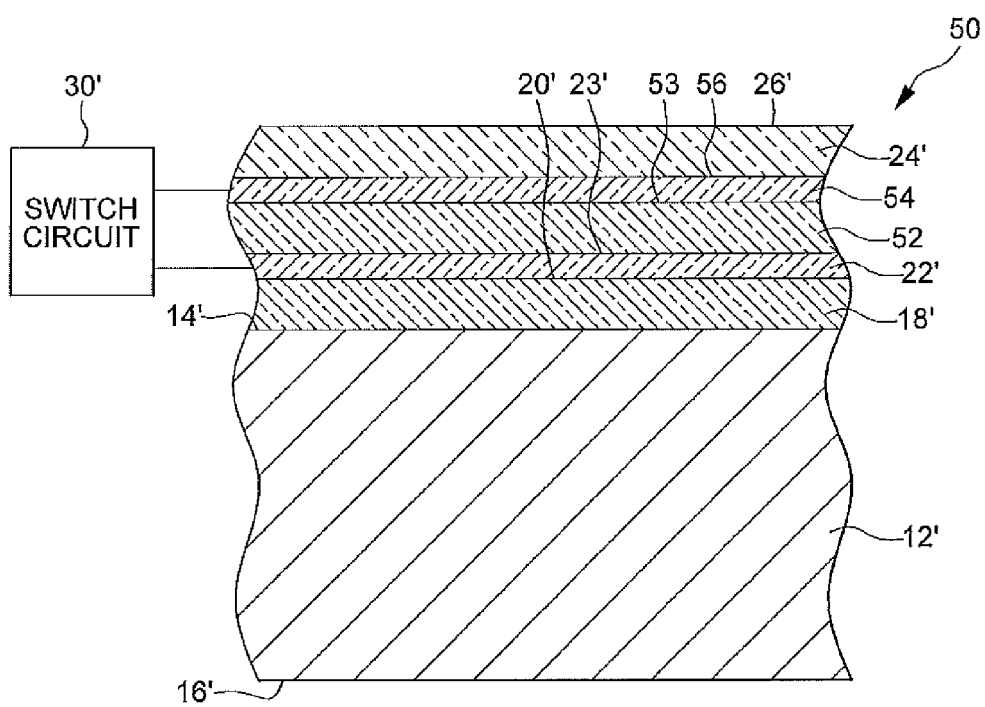
FIG. 2 is a schematic fragmentary cross sectional elevational view of a control panel according to another embodiment of the present invention.

FIG. 2 illustrates a control panel 50 according to an alternative embodiment of the present invention similar to the control panel 10 of FIG. 1, except as described below. Structure repeated from the description of FIG. 1 includes the same reference numeral with a prime (') symbol. As shown, the conductive panel 50 includes a substrate 12', a first dielectric layer 18', a first electrode layer 22', a second dielectric layer 52, a second electrode layer 54, and a protective film 24'. The second dielectric layer 52 is interposed between the first electrode layer 18' and the second electrode layer 52, wherein the second dielectric layer 52 is disposed on a front surface 23' of the first electrode layer 22' and the second electrode layer 54 is disposed on a front surface 53 of the second dielectric layer 52. The second dielectric layer 52 electrically isolates the first electrode layer 22' from the second electrode layer 54. It should be understood that the control panel 50 can include more than two electrode layers, wherein a dielectric layer is interposed between successive electrode layers. The protective film 24' may be disposed on a front surface 56 of the second electrode layer 54 to provide protection from the surrounding environment, militate against physical wear of the second electrode layer 54, and provide desired tactile and visual attributes to a front surface 26' of the control panel 10, for example.

The electrode layers 22', 54 are in electrical communication with a switch circuit 30'. The switch circuit 30 provides electrical energy to the electrode layers 22', 54 causing an electrical field to be created adjacent thereto and forming the sensing zone adjacent the front surface 26' of the control panel 50. A finger positioned in proximity to the sensing zone interacts with the electrical field from the electrode layers 22', 54 and changes the capacitance value of the electrical field of the electrode layers 22', 54, wherein the changed capacitance is detected by the switch circuit 30' as a switching event. Using the first electrode layer 22' together with the second electrode layer 54 provides a desired array of capacitance switches for the control panel 50, wherein a mutual capacitance of the electrode layers 22', 54 can be detected by the switch circuit 30'. Further, the use of two or more electrode layers provides for improved electrode packaging density. The remaining structure and function of the embodiment illustrated in FIG. 2 is substantially equivalent to the function and structure of the embodiment illustrated in FIG. 1 previously described herein.

Figure 3:
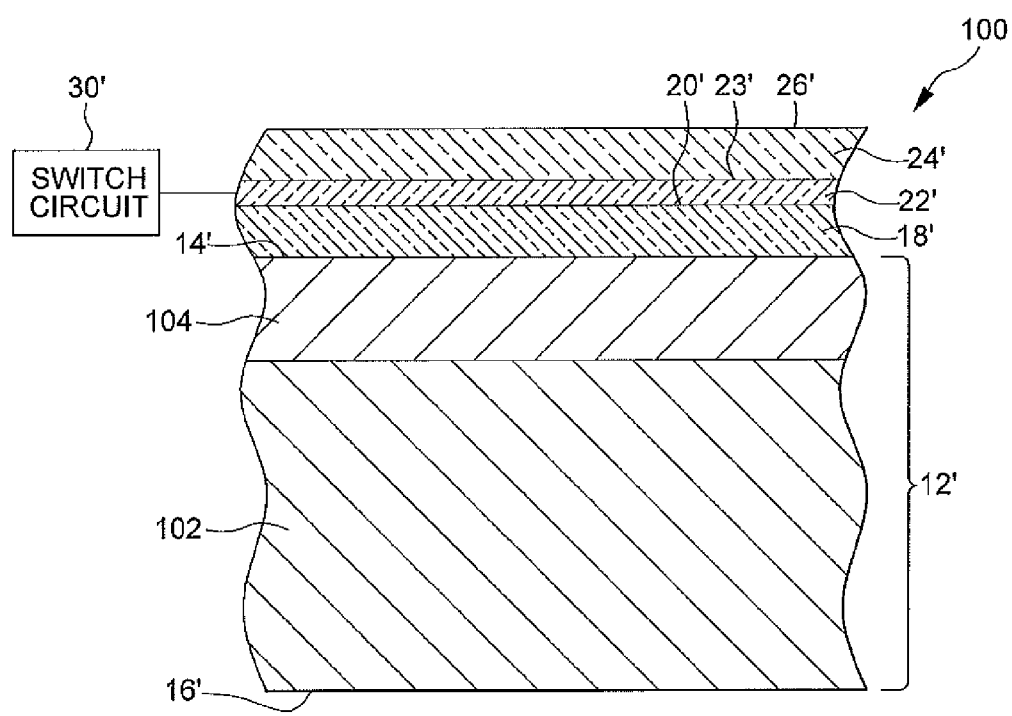
FIG. 3 is a schematic fragmentary cross sectional elevational view of a control panel according to another embodiment of the present invention.

FIG. 3 illustrates a cross sectional view of a control panel 100 according to an alternative embodiment of the present invention similar to the control panel 10 of FIG. 1, except as described below. Structure repeated from the description of FIG. 1 includes the same reference numeral with a prime (') symbol. As shown, the control panel 100 includes a substrate 12', a dielectric layer 18', an electrode layer 22', and a protective film 24'. The substrate 12' includes a base layer 102 and an electrically conductive layer 104. The base layer 102 can be formed from an electrically conductive material or an electrically non-conductive or a substantially electrically non-conductive material. The electrically conductive layer 104 is disposed on the substrate 102. The electrically conductive layer 104 can be produced from a metallic sheet, a decorative electrically conductive film, an electrically conductive composite material having a desired electrical conductivity, an electrically conductive paint, an electrically conductive ink, a vacuum metalized finish, or any other material having suitable electrical conductivity. The electrically conductive layer 104 is interposed between the base layer 102 and the dielectric layer 18' and is electrically grounded. The electrically conductive layer 104 includes the front surface 14' of the substrate 12' and provides a desired aesthetic appearance to the control panel 100. It should be understood that the control panel 100 can include two or more electrode layers, wherein a dielectric layer is interposed between successive electrode layers. The remaining structure and function of the embodiment illustrated in FIG. 3 is substantially equivalent to the function and structure of the embodiment illustrated in FIG. 1 previously described herein.

From the foregoing description, one ordinarily skilled in the art can easily ascertain the essential characteristics of this invention and, without departing from the spirit and scope thereof, make various changes and modifications to the invention to adapt it to various usages and conditions.

What is claimed is:

1. A control panel comprising:
an electrically conductive substrate having a front surface, wherein the substrate is electrically grounded;
a first dielectric layer disposed on the front surface of the substrate; and
a first electrode layer disposed on a front surface of the first dielectric layer and electrically isolated from the substrate, wherein the first electrode layer is in electrical communication with a switch circuit adapted to detect a change in a capacitance of the first electrode layer, and wherein the front surface of the substrate is a decorative surface substantially visible through the first dielectric layer and the first electrode layer.

2. The control panel according to claim 1, wherein the first dielectric layer is produced from at least one layer of a polymer film.

3. The control panel according to claim 1, wherein the first electrode layer is produced from indium tin oxide.

4. The control panel according to claim 1, wherein the substrate includes a base layer abutting an electrically conductive layer, the electrically conductive layer being electrically grounded and including the front surface of the substrate.

5. The control panel according to claim 1, wherein at least one of the first dielectric layer, the first electrode layer, the second dielectric layer, the second electrode layer, and the film is one of substantially transparent and substantially translucent.

6. The control panel according to claim 1, wherein the front surface of the substrate is metallic.

7. The control panel according to claim 1, further comprising a substantially transparent film covering the first electrode layer.

8. The control panel according to claim 7, wherein the film is formed from at least one of a polyester, a polycarbonate, a polyethylene, a polyethersulfone, an acrylic, and a plastic resin.

9. The control panel according to claim 1, further comprising a second dielectric layer disposed on the first electrode layer and a second electrode layer disposed on the second dielectric layer.

10. The control panel according to claim 9, wherein the front surface of the substrate is a decorative surface substantially visible through the first dielectric layer, the first electrode layer, the second dielectric layer, and the second electrode layer.

11. The control panel according to claim 9, wherein the entire first electrode layer is electrically isolated from the second electrode layer.

12. A control panel comprising:
an electrically conductive substrate having a front surface, wherein the substrate is electrically grounded;
a first dielectric layer disposed on the front surface of the substrate;
a first electrode layer disposed on a front surface of the first dielectric layer and electrically isolated from the substrate, the first electrode layer in electrical communication with a switch circuit adapted to detect a change in a capacitance of the first electrode layer;
a second dielectric layer disposed on a front surface of the first electrode layer;
a second electrode layer disposed on a front surface of the second dielectric layer; and
a film covering the second electrode layer, wherein the front surface of the substrate is a decorative surface substantially visible through the first dielectric layer, the first electrode layer, the second dielectric layer, the second electrode layer, and the film.

13. The control panel according to claim 12, wherein the first dielectric layer is formed from at least one layer of a polymer film.

14. The control panel according to claim 12, wherein the first electrode layer is produced from indium tin oxide.

15. The control panel according to claim 12, wherein the film layer is formed from at least one of a polyester, a polycarbonate, a polyethylene, a polyethersulfone, an acrylic, and a plastic resin.

16. The control panel according to claim 12, wherein the substrate includes a base layer and an electrically conductive layer, the electrically conductive layer being electrically grounded and including the front surface of the substrate.

* * * * *